(12) United States Patent
Nakagawa et al.

(10) Patent No.: US 7,745,239 B1
(45) Date of Patent: Jun. 29, 2010

(54) ARRANGEMENT OF FILL UNIT ELEMENTS IN AN INTEGRATED CIRCUIT INTERCONNECT LAYER

(75) Inventors: O. Samuel Nakagawa, Redwood City, CA (US); Andrew B. Kahng, Del Mar, CA (US); Pakman Wong, Cupertino, CA (US); Puneet Gupta, Santa Clara, CA (US)

(73) Assignee: Tela Innovations, Inc., Campbell, CA (US)

( * ) Notice: Subject to any disclaimer, the term of this patent is extended or adjusted under 35 U.S.C. 154(b) by 531 days.

(21) Appl. No.: 11/486,511

(22) Filed: Jul. 14, 2006

(51) Int. Cl.
*G01R 31/26* (2006.01)
*H01L 21/66* (2006.01)
*H01L 21/44* (2006.01)

(52) U.S. Cl. .................. 438/15; 438/598; 438/599; 257/E21.575

(58) Field of Classification Search .............. 438/14, 438/16, 597, 598, 599; 257/E21.575
See application file for complete search history.

(56) References Cited

U.S. PATENT DOCUMENTS

| | | | |
|---|---|---|---|
| 7,197,737 B1 * | 3/2007 | Iandolo et al. ............... 716/10 |
| 7,553,681 B2 * | 6/2009 | Raravikar et al. ............. 438/15 |
| 2002/0199162 A1 * | 12/2002 | Ramaswamy et al. .......... 716/8 |
| 2004/0157137 A1 * | 8/2004 | Juengling et al. .............. 430/5 |
| 2004/0237061 A1 | 11/2004 | Kahng et al. |

OTHER PUBLICATIONS

P. Gupta, A. B. Kahng, C. H. Park, Detailed Placement for Improved Depth of Focus and CD Control, Proc. Asia and South Pacific Design Automation Conf,. Jan. 2005, pp. 343-348.
Puneet Gupta, Andrew B. Kahng, Puneet Sharma, Dennis Sylvester, Selective Gate-Lengh Biasing for Cost-Effective Runtime Leakage Control, DAC 2004, Jun. 7-11, 2004, San Diego, California, USA.

\* cited by examiner

*Primary Examiner*—Alexander G Ghyka
*Assistant Examiner*—Seahvosh J Nikmanesh
(74) *Attorney, Agent, or Firm*—Martine Penilla & Gencarella LLP

(57) ABSTRACT

An integrated circuit having a metal interconnect layer, and also having a conductive line and a boundary defined with a uniform distance from the conductive line that defines a "keep out" distance between the boundary and the conductive line. A set of first fill elements are uniformly arranged along the boundary outside of the "keep out" distance, and a set of second fill elements further from the conductive line than the first fill elements are arranged in a pattern that would be uniform, but for having some fill elements missing from the pattern.

6 Claims, 1 Drawing Sheet

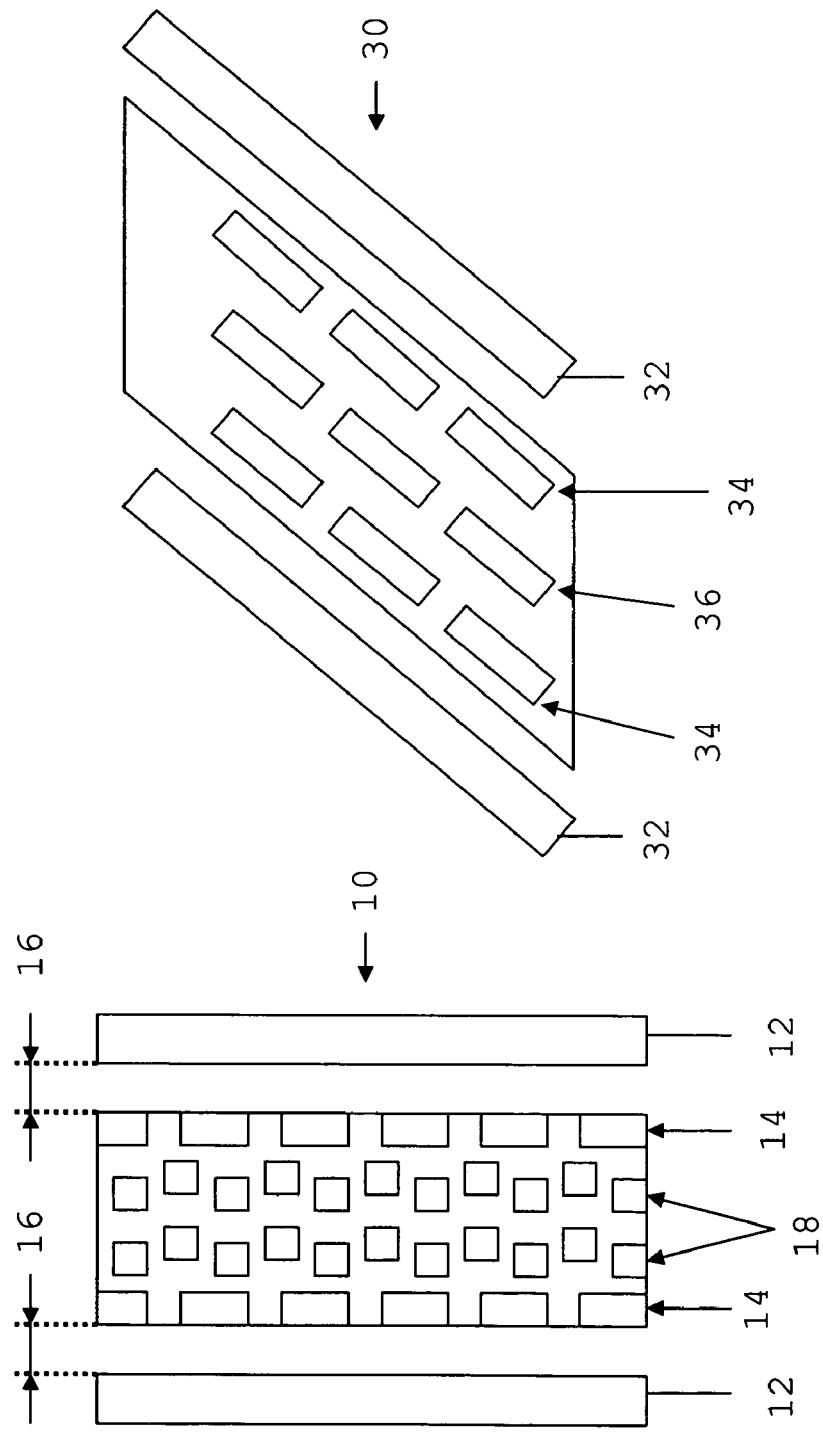

ARRANGEMENT OF FILL UNIT ELEMENTS IN AN INTEGRATED CIRCUIT INTERCONNECT LAYER

BACKGROUND

Integrated circuits, also referred to as "chips", must have a multi-layer interconnection structure, including a plurality of interwoven conductive lines to electrically connect elements in the semiconductor layers. Different techniques are used to build this structure, depending on whether the chip is aluminum-based or copper-based. A problem that is encountered in building an aluminum interconnection structure is varying dielectric thickness. For a copper interconnection structure, however, a problem of varying copper thickness can be encountered.

Copper-based chips are produced, in part, using a damascene or dual-damascene process. In this process, the underlying dielectric material layer is patterned with open trenches that are created in the desired locations of the prospective conductive lines. A thick coating of copper that significantly overfills the trenches is deposited on the dielectric material, and chemical-mechanical planarization or polishing (CMP) is used to remove the copper to the level of the top of the insulating layer.

With successive layers of insulator and copper, the multi-layer (5-10 metal layers or more) interconnection structure is created. Unfortunately, it has not yet been possible to equalize the rate at which copper is removed during CMP with the rate at which the dielectric material is removed, with the copper generally being removed more rapidly than the dielectric. Consequently, an area with more embedded copper lines will generally be removed more quickly, potentially leading to an uneven surface and uneven copper line thickness. In turn, this could affect the integrated-circuit performance in an unpredictable manner, because the electrical characteristics of the copper lines are affected by their thicknesses. More specifically, the thickness affects conductivity, capacitance, inductance, signal attenuation, and timing for a signal traveling through the structure.

With respect to the CMP process, ideally all of the dielectric would be uniformly exposed at the same moment, and the process would be brought to a stop at that moment. Sometimes, however, the dielectric layer is exposed in one region, but not exposed in another. The CMP process must continue until the dielectric is exposed across all regions. This causes some copper to be recessed relative to the dielectric ("dishing", or local "step height"), and removal of dielectric ("erosion", or global "step height").

For aluminum-based chips, aluminum structures are constructed first, and then covered with dielectric. Typically, however, before CMP the topography of the dielectric layer roughly follows the topography of the underlying aluminum structures. Although CMP is used to create a flat top surface, the post-CMP top surface of the dielectric will tend to be lower where the dielectric is covering a low density of aluminum structure, and higher where a high density of aluminum structure is covered. This variation is undesirable because the distance between layers becomes uneven and unpredictable, adding an element of uncertainty to the electromagnetic effects between layers. Also, such variation results in yield loss, because of the greater depth of focus uncertainty added into the fabrication process. Individual chips may be non-functional due to either an unwanted short or unwanted open circuit. Dummy or "fill" elements are typically added to a layout to reduce variation in the vertical position of the dielectric top surface. Unlike the situation with respect to a copper-based chip, however, metal structure thicknesses are not affected.

Frequently, non-functional metal elements ("fill") are added to the layout by the designer, thereby increasing the uniformity of the density of the metal pattern. This, in turn, prevents unevenness that could be caused by the CMP process as explained above.

Typically, after a preliminary layout, including fill, is completed, an optical proximity correction (OPC) program is executed to determine a set of mask aperture shape adjustments designed to enhance the effect of the masking process in photolithography. Running the OPC program is time-consuming, with the amount of time consumed, as well as the quality of the OPC solution, generally related to the spatial complexity of the preliminary layout. It is problematic if the spatial complexity of fill complicates and compromises the quality of the OPC solution for a given wire. Additionally, fill elements on a first layer can affect electrical characteristics of conductive lines on a second, typically neighboring, layer.

Other manufacturing steps for IC interconnects, specifically, the etching process, are strongly affected by the pattern context of a given manufactured wire. Thus, the chips actually produced by etch processes are more likely to match the design characteristics assumed in the Electronic Design Automation (EDA) tools, if the fill postulated by the EDA tools and used in the analyses performed by these tools is changed in a manner designed to minimize the effect on electrical characteristics.

SUMMARY

The following embodiments and aspects thereof are described and illustrated in conjunction with systems, tools and methods, which are meant to be exemplary and illustrative, not limiting in scope. In various embodiments, one or more of the above-described problems have been reduced or eliminated, while other embodiments are directed to other improvements. In particular, common to each aspect of the invention is that the complexity and quality of OPC, as well as the predictability of electrical consequences of etch process and multi-layer interconnect structure effects are improved by establishing a uniform pattern environment for one or more metal interconnect lines.

In a first separate aspect, the present invention may take the form of an integrated circuit chip having a metal interconnect layer, and also having a metal interconnect line portion, and a boundary defining a uniform distance from the metal interconnect portion that defines a "keep out" distance between the boundary and the metal interconnect. A set of first fill elements are uniformly arranged along the boundary, outside of the "keep out zone," and a set of second fill elements is arranged having larger displacement from the metal interconnect line portion than the first set of fill elements. The larger displacement could be in terms of physical distance, or in terms of lesser effect on electrical performance.

In a second separate aspect, the present invention may take the form of a method of producing an integrated circuit chip having a metal interconnect layer to meet a set of design criteria. The method begins with a prospective interconnect line portion of the interconnect layer, and starts by defining a "keep out" distance. A prospective first fill pattern, made up of fill elements is uniformly placed along a line that is the "keep out" distance from the interconnect line. Also, a second prospective fill pattern, having a larger displacement from the interconnect line than the first fill pattern, is added. The prospective first fill pattern is changed only if the set of design criteria cannot be met by modifying the second prospective fill pattern.

In a third separate aspect, the present invention may take the form of computer readable media, hosting a computer program that when run on a computer, causes the following steps to be performed with respect to an interconnect line portion of a metal interconnect layer of a prospective chip layout, for which a set of design criteria have been established. A "keep out" distance from the interconnect line portion is defined. A prospective first fill pattern is made up of fill elements uniformly placed along a line that is the "keep out" distance from the interconnect line. Finally, a second prospective fill pattern is further away from the interconnect line than the first fill pattern. The computer program changes the prospective first fill pattern only if the set of design criteria cannot be met by modifying the second prospective fill pattern.

In addition to the exemplary aspects and embodiments described above, further aspects and embodiments will become apparent by reference to the drawings and by study of the following detailed descriptions.

BRIEF DESCRIPTION OF THE FIGURES

Exemplary embodiments are illustrated in referenced figures of the drawings. It is intended that the embodiments and figures disclosed herein are to be considered illustrative rather than restrictive.

FIG. 1 is a plan view of a portion of an integrated circuit layout.

FIG. 2 is a plan view of an alternative portion of an integrated circuit layout.

DETAILED DESCRIPTION OF THE PREFERRED EMBODIMENTS

Referring to FIG. 1, a network layout 10 that is completed with respect to the active elements and the conductive lines 12 has a first set of fill, or dummy conductive elements 14 added to it, so that it will have a fairly uniform metal pattern density. In addition, each conductive line 12 has, defined about it, a "keep out zone" or distance 16, within which no other layout elements may be placed. The use of a keep out zone prevents fill elements from causing unforeseen harmful effects in closely positioned interconnect elements due to inaccuracies of the OPC and fabrication processes.

According to a first preferred embodiment, for each conductive line 12, the first fill pattern 14 is defined in the form of elements that are uniformly spaced along the outer edge of the "keep out" distance 16. A second fill pattern 18 is defined in the form of fill elements that are more displaced from conductive lines 12 than the first fill pattern 14. This greater displacement could be in terms of physical distance or in terms of the effect on the electrical performance of conductive line 12. Further, the circuit design goals are addressed first by modifying, that is, adding to, subtracting from, or rearranging, the second fill pattern 18. Only if this process does not result in the design goals being met may any of the first fill pattern elements 14 be removed, shifted or moved. In a preferred embodiment, the first fill pattern elements 14 are geometrically different from the second fill pattern elements. In a more particular preferred embodiment, fill pattern elements 14 are rectangles with a high-aspect ratio with its long-side co-linear along the "keep out" boundary 16 to minimize shape perturbation of the conductive lines due to lithographic and OPC processes, whereas fill pattern elements 18 are rectangles that may be squares.

Referring to FIG. 2, showing an additional section of a chip layout 30, the process may also be used for diagonal lines 32, that is, those lines that are at an acute angle (typically 45°) to most of the other lines, which are generally laid out in just two perpendicular directions that are parallel to the coordinate axes. A set of fill elements 34, extending uniformly near the sides of diagonal line 32 has been provided. In a similar alternative embodiment, a second set of fill elements 36 is added interior to elements 34, and this second set of fill elements 36 may be modified, whereas every effort is made to maintain the integrity of the first set of fill elements 34. Both sets of elements 34 and 36 are oriented so as to parallel line 32, thereby providing a more uniform spacing from fill elements 34 and 36 to line 32.

In one preferred embodiment the process of layout optimization is performed by an optimizer computer program. This program would implement the method described above, modifying an initial prospective layout, and calculating the changes to system performance that would result. In a preferred embodiment, the prospective layout is entered into the optimizer with information concerning effects of removing or leaving in each particular fill element or set of elements. Only if the design performance criteria could not be met by modifying the prospective layout of the second fill elements 18 does the program alter the layout of the first fill elements.

The uniformity in the layout of fill elements near conductive lines imparted during this process causes a better result to be created by the optical proximity correction (OPC) program, which is executed after the layout of the fill elements. Moreover, the OPC program typically is able to finish execution more quickly. This is because the OPC program can more easily accommodate linearly uniform layouts, so that a uniform line of fill elements near a straight conductive line is much easier to accommodate than a non-uniform set of fill elements.

Moreover, the etching of the straight line of fill elements behaves more predictably than would the etching of a more unevenly or more randomly positioned set of fill elements. In addition, the finished fill elements have an effect on timing that is relatively easy to predict and take into account during the design process.

Fill elements on a first layer of the interconnect structure affect the electrical characteristics of connection lines on other layers, particularly neighboring layers. Accordingly, in one preferred embodiment, the first set of fill elements can be on a first layer, and proximate to a conductive line on a neighboring layer. By avoiding changes to the first set of fill elements, the invention minimizes the chance that changes on the first layer will alter the electrical characteristics of interconnects on neighboring layers to such a degree as to induce inaccuracy of timing, power, signal integrity, or other analyses within the EDA tool flow.

While a number of exemplary aspects and embodiments have been discussed above, those possessed of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

The invention claimed is:

1. A method of producing an integrated circuit having a metal interconnect layer that includes an interconnect line, to meet a set of design criteria, said method comprising:
    (a) defining a "keep out" distance;
    (b) linearly orienting fill elements along a line that is said "keep out" distance from said interconnect line so as to generate a uniform line of fill elements, the uniform line of fill elements defining a prospective first fill pattern; and (c) adding a second prospective fill pattern, more displaced from said interconnect line than said first fill pattern and changing said prospective first fill pattern only if said set of design criteria cannot be met by modifying said second prospective fill pattern.

2. The method of claim 1, performed by a computer loaded with an optimizer computer program.

3. The method of claim 1, wherein said second prospective fill pattern is more displaced from said interconnect line in that it is more physically distant from said interconnect line.

4. The method of claim 1, wherein said second prospective fill pattern is more displaced from said interconnect line in that it has been determined to have less effect on characteristics of the interconnect line.

5. Computer readable media, hosting a computer program that when executed on a computer causes the following steps to be performed with respect to a conductive line of a metal interconnect layer of a prospective integrated circuit layout for which a set of design criteria have been established:

(a) defining a "keep out" distance from said conductive line;

(b) linearly orienting fill elements along a line that is said "keep out" distance from said conductive line so as to generate a uniform line of fill elements, the uniform line of fill elements defining a prospective first fill pattern; and (c) adding a second prospective fill pattern, more displaced from said conductive line than said first fill pattern, and changing said prospective first fill pattern only if said set of design criteria cannot be met by modifying said second prospective fill pattern.

6. The media of claim 5, wherein said program is adapted so as to, when executed, receive an initial prospective layout, and wherein said initial prospective layout contains information regarding the effect of prospective fill elements on neighboring circuitry.

* * * * *